(12) United States Patent
Liggenstorfer-Heimlicher et al.

(10) Patent No.: US 10,779,426 B2
(45) Date of Patent: Sep. 15, 2020

(54) PROXIMITY SENSOR

(71) Applicant: OPTOSYS SA, Corminboeuf (CH)

(72) Inventors: Annette Liggenstorfer-Heimlicher, Kilchberg (CH); Roland Bochud, Noréaz (CH); Laurent Genilloud, Romont (CH)

(73) Assignee: OPTOSYS SA (CH)

( * ) Notice: Subject to any disclaimer, the term of this patent is extended or adjusted under 35 U.S.C. 154(b) by 135 days.

(21) Appl. No.: 16/010,950

(22) Filed: Jun. 18, 2018

(65) Prior Publication Data
US 2018/0375514 A1   Dec. 27, 2018

(30) Foreign Application Priority Data

Jun. 21, 2017   (EP) ..................................... 17177196
Nov. 10, 2017   (EP) ..................................... 17201072

(51) Int. Cl.
*H05K 5/02*       (2006.01)
*H05K 1/18*       (2006.01)
(Continued)

(52) U.S. Cl.
CPC ............. *H05K 5/0226* (2013.01); *G01D 5/14* (2013.01); *G01D 5/20* (2013.01); *G01D 5/26* (2013.01);
(Continued)

(58) Field of Classification Search
CPC ........ G01R 27/04; G01R 27/16; G01R 27/32; G01B 7/30; G01B 7/003; G01B 7/107
(Continued)

(56) References Cited

U.S. PATENT DOCUMENTS 7,280,167 B2 * 10/2007 Choi ................... G02F 1/13338
345/174
8,476,912 B2    7/2013 Dorrough
(Continued)

FOREIGN PATENT DOCUMENTS

AU      2013270535 A1    1/2014
DE   10 2009 000 571 A1    8/2010
(Continued)

OTHER PUBLICATIONS

European Search Report dated Dec. 7, 2017 in corresponding European Patent Application No. EP 17 17 7196.
(Continued)

*Primary Examiner* — Giovanni Astacio-Oquendo
(74) *Attorney, Agent, or Firm* — Ostrolenk Faber LLP

(57) ABSTRACT

A proximity sensor for detecting the proximity of an object, including a sensing element, a detection circuitry provided on a circuit board, and a housing with a rear portion adjoining a rear end of the housing and a front portion adjoining a front end of the housing, the sensing element being arranged inside the front portion of the housing to interact with the object through the front portion, the detection circuitry being interconnected with the sensing element to receive a detection signal from the sensing element, the housing including side walls extending in a longitudinal direction from the rear end to the front end of the housing, the side walls surrounding the circuit board. To allow a better flexibility of the sensor along its length expansion, the circuit board includes at least one bendable section extending in a transverse direction with respect to the longitudinal direction and that the side walls substantially consist of at least one flexible material in a region surrounding the bendable section of the circuit board such that the sensor is bendable through the transverse direction.

16 Claims, 3 Drawing Sheets

(51) Int. Cl.
  *H03K 17/95* (2006.01)
  *G01D 11/24* (2006.01)
  *H05K 1/02* (2006.01)
  *H05K 1/14* (2006.01)
  *G01D 5/14* (2006.01)
  *G01D 5/20* (2006.01)
  *G01D 5/26* (2006.01)
  *H05K 5/03* (2006.01)
  *H03K 17/945* (2006.01)
  *H05K 3/46* (2006.01)
  *G01V 3/08* (2006.01)
  *G01V 8/10* (2006.01)
  *H05K 5/00* (2006.01)

(52) U.S. Cl.
  CPC ......... *G01D 11/245* (2013.01); *H03K 17/952* (2013.01); *H03K 17/9505* (2013.01); *H05K 1/0277* (2013.01); *H05K 1/148* (2013.01); *H05K 1/189* (2013.01); *H05K 5/03* (2013.01); *G01V 3/08* (2013.01); *G01V 8/10* (2013.01); *H03K 17/945* (2013.01); *H05K 1/028* (2013.01); *H05K 1/0278* (2013.01); *H05K 3/4691* (2013.01); *H05K 5/0034* (2013.01); *H05K 2201/09263* (2013.01); *H05K 2201/10151* (2013.01)

(58) Field of Classification Search
  USPC ............................ 324/207.16, 230, 629, 633
  See application file for complete search history.

(56) References Cited

U.S. PATENT DOCUMENTS

| | | | |
|---|---|---|---|
| 8,669,772 B2 | 3/2014 | Dorrough | |
| 8,736,283 B2 | 5/2014 | Dorrough | |
| 8,791,708 B2 | 7/2014 | Dorrough | |
| 8,836,347 B2 | 9/2014 | Dorrough | |
| 8,884,633 B2 | 11/2014 | Dorrough | |
| 8,929,085 B2 | 1/2015 | Franklin et al. | |
| 9,228,969 B2 | 1/2016 | Dorrough | |
| 9,239,221 B2 | 1/2016 | Heimlicher | |
| 9,274,562 B2 | 3/2016 | Franklin et al. | |
| 9,541,371 B2 | 1/2017 | Pettersson et al. | |
| 9,557,874 B2 | 1/2017 | Franklin et al. | |
| 9,952,035 B2 | 4/2018 | Uedaira | |
| 9,971,448 B2 | 5/2018 | Franklin et al. | |
| 10,123,582 B2 | 11/2018 | Crossman et al. | |
| 2004/0000632 A1* | 1/2004 | Apte ................ | H01L 27/14634 250/208.1 |
| 2006/0059056 A1* | 3/2006 | Tsuchida ............ | H03K 17/9505 324/207.15 |
| 2011/0215818 A1 | 9/2011 | Dorrough | |
| 2012/0256077 A1* | 10/2012 | Yen ................... | H01L 27/14609 250/208.1 |
| 2013/0083496 A1 | 4/2013 | Franklin et al. | |
| 2014/0125369 A1* | 5/2014 | Erickson ............ | G01R 31/307 324/754.22 |
| 2014/0203827 A1* | 7/2014 | Thangaraju ....... | H01L 21/76898 324/713 |
| 2015/0000370 A1 | 1/2015 | Crossman et al. ........... | 73/12.04 |
| 2015/0187680 A1* | 7/2015 | Seo ................... | G01R 31/2853 324/762.01 |
| 2016/0270234 A1 | 9/2016 | Ahn | |
| 2016/0271420 A1 | 9/2016 | Pina | |
| 2016/0356642 A1 | 12/2016 | Uedaira | |

FOREIGN PATENT DOCUMENTS

| | | |
|---|---|---|
| DE | 20 2011 051 554 U1 | 2/2013 |
| EP | 2 677 270 A1 | 12/2013 |
| EP | 2 725 715 A1 | 4/2014 |
| EP | 3 068 198 A1 | 9/2016 |

OTHER PUBLICATIONS

European Search Report dated Apr. 17, 2018 in corresponding European Patent Application No. EP 17 20 1072.

European Examination Report dated Jul. 10, 2019 issued in corresponding European Application No. 17201072.0.

Adrien Debelle et al.: "Soft Encapsulation of Flexible Electrical Stimulation Implant: Challenges and Innovations", *Eur J Transl Myol*, Jan. 1, 2016, 26 (4), pp. 292-296, XP05560197, retrieved from the Internet: URL: https://www.ncbi.nlm.gov/pmc/articles/PMC5220220/pdf/ejtm-2016-4-6298.pdf.

Thomas Kinkeldei et al.: "Encapsulation for Flexible Electronic Devices", *IEEE Electron Device Letters*, vol. 32, No. 12, Dec. 2011, pp. 1743-1745 XP011369784, ISSN: 0741-3106, DOI: 10.1109/LED.2011.2168378.

* cited by examiner

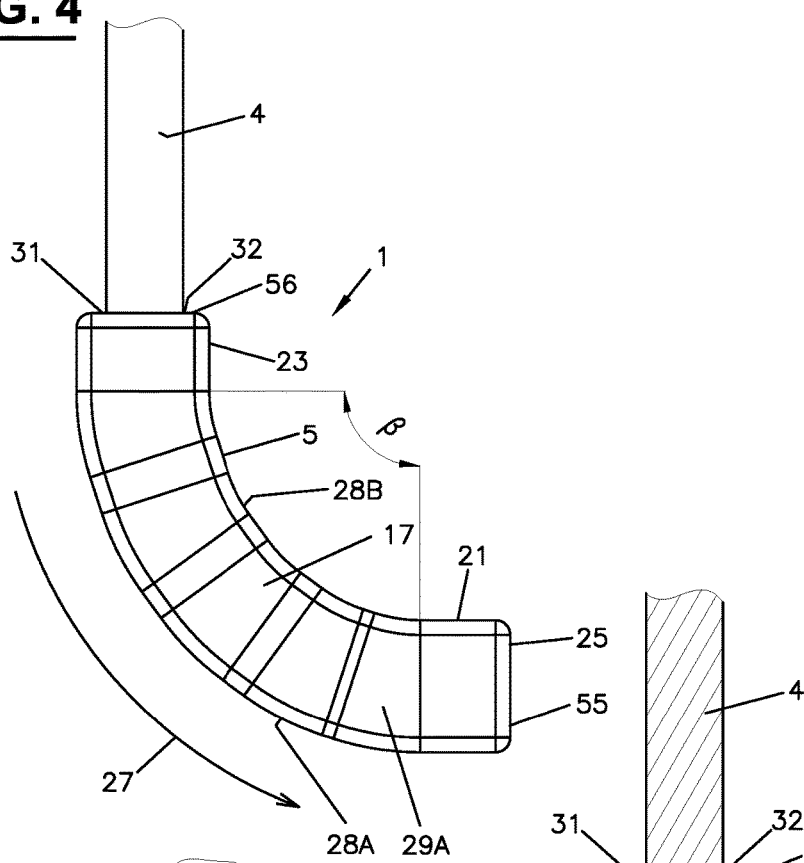
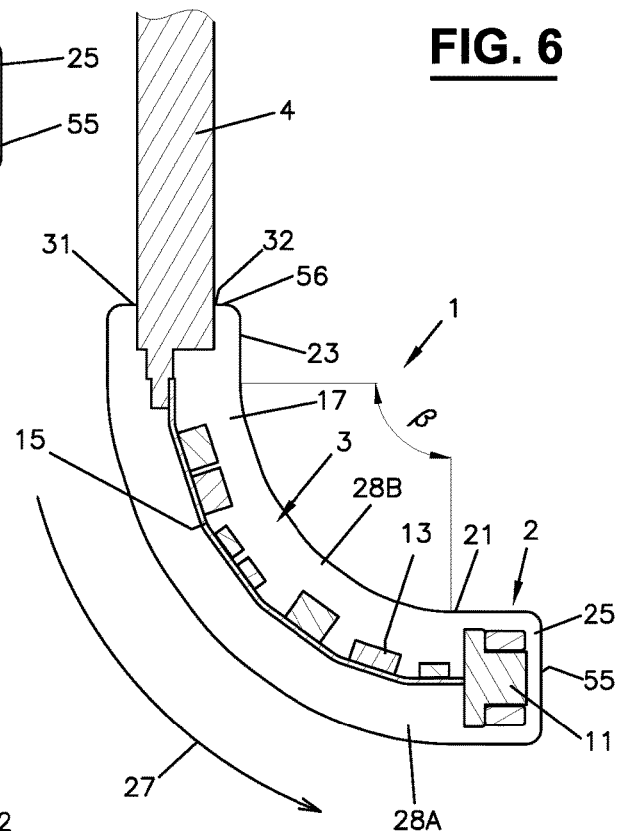
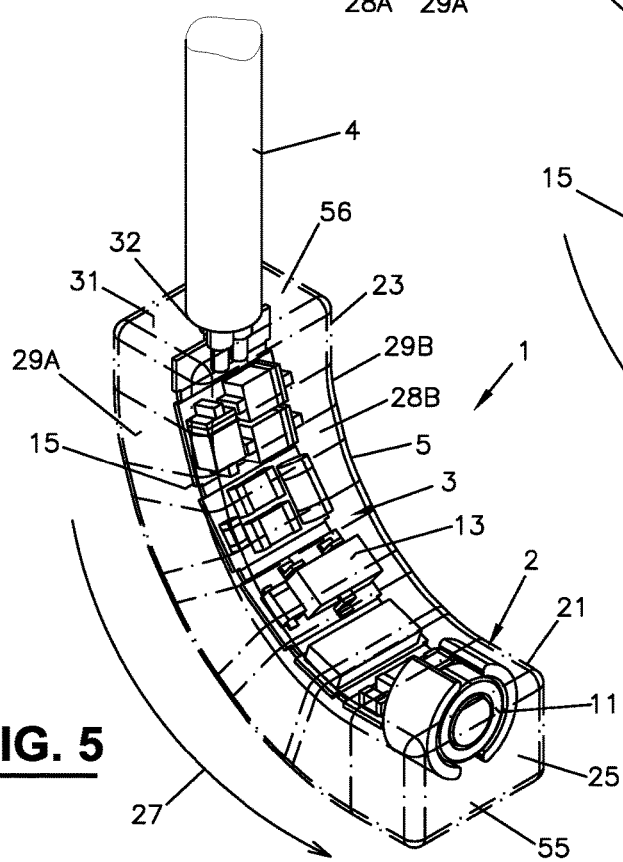

PROXIMITY SENSOR

FIELD OF THE INVENTION

The present invention relates to a proximity sensor for detecting the proximity of an object. The sensor comprises a sensing element, a detection circuitry provided on a circuit board, and a housing with a rear portion adjoining a rear end of the housing and a front portion adjoining a front end of the housing. The sensing element is arranged inside the front portion of the housing such that it is adapted to interact with the object through the front portion. The detection circuitry is interconnected with the sensing element in order to receive a detection signal from the sensing element. The housing comprises side walls extending in a longitudinal direction from the rear end to the front end of the housing, wherein the side walls are surrounding the circuit board.

BACKGROUND OF THE INVENTION

A sensor of that type is know from EP 2 725 715 A1 to the same applicant. Typically, such a sensor has a length that is quite larger than the width and the height dimensions of the sensor's front portion. A housing geometry of that kind is needed to accommodate the detection circuitry behind the sensing element such that a measuring signal of good quality can be provided. But mostly the front portion is useful as an effective area for a detection of the presence or absence of an object. As a result, the sensor must be positioned in such a way that the sensor along its straight longitudinal expansion is pointing toward the object in order to ensure a functioning position of the sensor with the front portion facing the object.

Often, however, a certain degree of freedom would be desirable for allowing a more flexible handling of the sensor's length expansion behind the object. A simple example is the case, when there is only a small amount of space behind the object for which the sensor may be too long. Also in view of newer applications, a higher adaptability of the sensor's length expansion would be beneficial. Those include, for instance, a use of the sensor in robotic applications during which the sensor is continuously moved and may also be exposed to external forces. The high rigidity of the sensor along its length direction, however, does not only inhibit an exact positioning of the sensor's front portion with respect to a target area during such an external movement, which strongly compromises its detection reliability, but also poses the risk of damaging the sensor, in particular during a forcibly actuated bending of the sensor.

SUMMARY OF THE INVENTION

It is an object of the present invention to remedy at least one of the above mentioned disadvantages and to provide the initially addressed proximity sensor with an increased flexibility along its length expansion. It is another object to provide a good protection for such a sensor against harmful external influences, thus allowing in particular a reliable sensor operation during and after a bending of the sensor. It is yet another object to provide such a sensor in a cost efficient manner.

At least one of these objects is achieved by the proximity sensor according to claim 1. The dependent claims define preferred embodiments.

Accordingly, the invention suggests that the circuit board comprises at least one bendable section extending in a transverse direction with respect to said longitudinal direction, and that the side walls substantially consist of at least one flexible material in a region surrounding said bendable section of the circuit board such that the sensor is bendable through said transverse direction. In this way, the flexibility of the sensor along its length expansion in the longitudinal direction can be increased, thus allowing in particular a bending of the sensor in its longitudinal direction of expansion. It has been surprisingly found during the course of the present invention that an appropriate arrangement of such a flexible material in the region around the bendable section of the circuit board can already provide a sufficient protection of the interior components of the sensor for many applications such that no additional protection measures are required, at least in this region. Besides an increased ability of the sensor to be bent, the invention therefore can also allow a comparatively effortless and cost-efficient construction of the sensor.

The term flexible material generally refers to any material having the property of a sufficiently low stiffness or rigidity, thus allowing a material deformation by an external impact of a comparatively low force, for instance such as a force induced by a manual handling of the sensor. An elementary idea of the present invention is to apply such a material or a combination of such materials in such a way that the desired bending property of the sensor in the longitudinal direction of expansion can be achieved and at the same time a sufficient protection of vulnerable internal sensor components can be provided. It has also been found during the invention that such a solution can contribute to a cost efficient production of the sensor, since in a preferred configuration no additional mechanical parts such as rotating joints or pivot links are required to allow the bending of the sensor. According to the invention, a portion of the housing surrounding the bendable section of the circuit board is thus preferably only composed of at least one of such a flexible material.

Thus, the housing of the sensor preferably only consists of the at least one flexible material in the region surrounding the bendable section of the circuit board. According to a preferred configuration, at least the side walls of the housing substantially only consist of the at least one flexible material. It has been found during the course of the present invention that such a housing consisting of the at least one flexible material over a respective bending region in the longitudinal direction can offer the additional advantage of a comparatively large bending angle in which the sensor can be bent with regard to an unbent state of the sensor in which the side walls of the housing extend in a rectilinear direction. This large bending angle may not be feasible in a case in which the housing would comprise more rigid or stiff parts that are linked together via additional mechanical parts such as rotating joints or pivot links in order to allow a certain bendability of the sensor. Preferably, a front wall and/or a rear wall of the sensor also comprises the at least one flexible material. More preferred, also the front wall and/or rear wall of the sensor substantially consists of the at least one flexible material.

According to the invention, an advantageous arrangement of the circuit board inside the housing can contribute to the flexibility of the sensor. To this end, the circuit board preferably extends through the middle of a length of the housing in said longitudinal direction. More preferred, the circuit board also extends into a quarter of the length of the housing that is located at the rear end of the housing and/or into a quarter of the length of the housing that is located at the front end of the housing. In this way, the circuit board is preferably equally distributed over a major part of the length of the housing in the longitudinal direction which may contribute to a facilitated bending of the sensor. Preferably, the circuit board thus extends into the rear portion and into the front portion of the housing. The rear portion and the front portion are preferably adjacent to one another. According to a preferred configuration, the rear portion of the housing and the front portion of the housing each constitute about half of the length of the housing in the longitudinal direction. Preferably, the length of the circuit board thus corresponds to at least half, more preferred at least two third, of the length of the surrounding side walls in the longitudinal direction of the housing. The length of the circuit board preferably extends substantially in parallel to the longitudinal direction of the housing.

Moreover, the bending properties of the circuit board can have an impact on the flexibility of the sensor. According to a preferred configuration, the circuit board comprises a number of bendable sections separated from each other in the longitudinal direction by more rigid sections in between. The circuit board is thus preferably bendable through the transverse direction at the distinct bendable sections of the circuit board. At least the more sensitive components of the detection circuitry are then preferably provided at the more rigid sections of the circuit board. At least each of regions of the side walls surrounding the separated bendable sections of the circuit board preferably consists substantially of the at least one flexible material.

According to a more preferred configuration, the circuit board comprises a continuous bendable section extending in the longitudinal direction along which the circuit board is bendable across the transverse direction at multiple locations positioned continuously next to each other along the longitudinal direction. To this end, the bendable section is preferably provided over a distance of at least half, more preferred at least two thirds, of a length of the circuit board in said longitudinal direction. Most preferred, the bendable section is provided over the complete length of the circuit board in the longitudinal direction. In this way, the flexibility properties of the sensor can be maximized.

Preferably, the circuit board substantially consists of at least one flexible material. In particular, the circuit board is preferably formed from a flexible plastic substrate. The flexible plastic substrate preferably comprises at least one of a polyimide, a polyether ether ketone (PEEK), and a polyester.

Also geometric characteristics of the circuit board can contribute to a desired flexibility of the sensor. To this end, the circuit board preferably has a length in said longitudinal direction exceeding a width of said circuit board perpendicular to said longitudinal direction by at least a factor of 1.5, more preferred by at least a factor of 2. An even more preferred length of the circuit board exceeds the width of the circuit board by at least a factor of 3. In this way, a desired bending property of the circuit board along the transverse direction can be advantageously enhanced, whereas an undesired bending of the circuit board across the longitudinal direction can be impeded.

In order to further improve the bending properties of the sensor, the region of the side walls consisting of the at least one flexible material preferably extends over a distance of at least half, more preferred at least two thirds, of the length of the circuit board in the longitudinal direction. Even more preferred, the region of the side walls consisting of the at least one flexible material extends at least over the complete length of the circuit board. Preferably, the side walls have a height perpendicular to said longitudinal direction that is smaller than a length of the circuit board in said longitudinal direction by at least a factor of 2, more preferred by a factor of at least 3, and even more preferred by a factor of at least 4. Such a comparatively small height of the side walls can advantageously correspond to a rather thin design of the sensor which can therefore be more easily bendable.

According to a preferred configuration, the side walls have a substantially rectangular cross section perpendicular to the longitudinal direction, in particular in the region of the side walls consisting of the at least one flexible material. The side walls then preferably comprise two parallel lateral side walls extending along a height of the housing and two parallel vertical side walls extending along a width of the housing. Preferably, the length of the housing in the longitudinal direction is larger than the width and the height of the housing. In this way, a good flexibility of the sensor can be provided that is sufficient for many applications. According to another configuration, the side walls may have a substantially circular cross section. A circular cross section of the sensor can be desirable for applications in which the installation and/or handling of the sensor require a substantially circular cylindrical shape. Also other shapes of the cross section of the side walls are conceivable.

According to a preferred implementation, the housing has a total length in the longitudinal direction of at most 100 mm. In this implementation, a preferred width or diameter of the housing perpendicular to the longitudinal direction is at most 50 mm. This implementation has been found to provide good bending properties of the sensor and at the same time allows a simple handling of the sensor. Preferably, the housing has a substantially cylindrical shape, in particular a rectangular or polygonal or circular cylindrical shape.

Preferably, the front portion comprises a front wall at the front end of the housing. The sensing element is preferably adjoining the front wall inside the front portion. In this way, the sensitivity for an advantageous detection of objects in particular in front of the front wall can be maximized.

Preferably, the proximity sensor further comprises a transmission cable. The transmission cable is preferably connected to the detection circuitry inside the housing and passes through the rear portion of the housing toward the exterior of the housing. In this way, a measuring signal generated by the detection circuitry can be transmitted by the transmission cable. Preferably, the transmission cable is passing through the rear end of the housing. Such a provision of the outgoing transmission cable at the rear end of the housing can be particularly advantageous in view of the bending properties of the sensor along the side walls in the longitudinal direction, since the transmission cable can thus not disturb the freedom of movement during the bending at the side walls. The rear portion preferably comprises a rear wall at the rear end of the housing. The transmission cable preferably passes through the rear wall.

Preferably, the side walls substantially fill out the volume surrounding the circuit board and detection circuitry, at least in the region of the side walls that consist of the at least one flexible material. This may not only contribute to the improved bending properties of the sensor, but also to an improvement of a protection of the components inside the housing. In particular, a protection against contamination, external shocks and heat may be provided by an appropriate flexible material provided in such a way.

Preferably, the at least one flexible material of the side walls is provided by at least one molding compound. Preferably, at least one molding compound is directly applied on the circuit board and the detection circuitry provided thereon. In this way, the circuit board and detection circuitry are preferably encapsulated by the molding compound, at least in the region of the side walls surrounding the bendable section of the circuit board. According to a preferred configuration, at least one of the molding compounds is formed from an organic material, more preferred a polymer, in particular a thermoplastic and/or an elastomer, in particular polyurethane (PUR). According to another preferred configuration, at least one of the molding compounds is formed from a thermoplastic elastomer (TPE). Those materials can provide the desired bending properties and also a good protection of the circuit board and the detection circuitry against harmful influences, such as external shocks, heat and particle contamination.

According to yet another preferred configuration, a number of molding compounds are applied on top of each other, at least around the bendable region of the circuit board. Preferably, an inner molding directly applied on the circuit board is provided, for instance a molding comprising a PUR, and an outer molding surrounding the inner molding is provided, for instance a molding comprising a TPE. In this configuration, the housing is thus preferably provided by a combination of a number of moldings including an inner molding compound, in which the circuit board is embedded, and an outer molding compound providing an external cover for the inner molding compound. The molding compound of the external cover of the housing is preferably chosen from a different material than the molding compound of the inner molding, in which the circuit board is enclosed. In this way, additional material properties can be advantageously combined to account for an advanced protection of the detection circuitry and the circuit board inside the housing.

Preferably, the at least one molding compound has a thickness of at least 0.5 mm, more preferred at least 1 mm, on top of a surface of the circuit board on which components of the detection circuit are provided. Preferably, the at least one molding compound has a thickness of at least 0.2 mm, more preferred at least 0.5 mm, on top of a surface of the circuit board on which no components of the detection circuit are provided. In this way, a protection of the sensor against harmful external influences can be provided that is sufficient for many purposes. Preferably, the at least one molding compound has a thickness of at most 10 mm, more preferred at most 5 mm, in particular on top of a surface of the circuit board on which components of the detection circuit are provided and/or on top of a surface of the circuit board on which no components of the detection circuit are provided. In this way, a sufficient degree of flexibility of the sensor can be provided.

A bending angle is defined as an angle at which a portion of the side walls is deflectable with respect to a position of this portion of the side walls in an unbent state of the side walls in which the side walls extend rectilinearly in the longitudinal direction, in particular along the rear portion and the front portion of the housing. The deflectable portion of the side walls may refer to a portion of the rear portion and/or the front portion of the housing. In particular, the bending angle is defined as an angle at which the side walls can be bent in the region around the bendable section of the circuit board. Thus, the bending angle is 0° in an unbent state of the sensor in which the side walls of the housing preferably extend rectilinearly, i.e. substantially along a straight line, in the longitudinal direction, in particular along the rear portion and the front portion of the housing. A bending angle larger than 0° is preferably provided during bending of the sidewalls within this region, wherein the bending angle corresponds to the angular deflection of a portion of the side walls from the position of this portion of the side walls in the unbent state of the sensor. Preferably, the side walls are configured to be bendable at a bending angle of at least 30°, more preferred at least 60°.

Preferably, the at least one molding compound covers the front end of the housing such that a front wall of the housing is provided by the molding compound. This can provide an enhanced encapsulation of the various components inside the housing and therefore an increased protection. Accordingly, the at least one molding compound preferably covers the rear end of the housing such that a rear wall of the housing is provided by the molding compound. In particular, the passage of the transmission cable through the housing is preferably surrounded by the at least one molding component.

Preferably, the at least one molding compound is provided at least over a total length of the circuit board in the longitudinal direction. Preferably, the at least one molding compound is provided at least over a total width of the circuit board in a direction perpendicular to the longitudinal direction. More preferred, the at least one molding protrudes from the circuit board in the longitudinal direction and or in a direction perpendicular to the longitudinal direction in order to provide a secure encapsulation of the circuit board inside. According to a preferred configuration, the housing only consists of the at least one flexible material, in particular the at least one molding compound.

The front portion of the housing and the sensing element located inside the front portion are preferably configured such that the sensing element is adapted to interact with the object through the front portion. According to a first preferred configuration, the sensing element is adapted to interact with the object at least through the front wall of the front portion. According to a second preferred configuration, the sensing element is adapted to interact with the object at least through the side wall within the front portion.

In general, the sensing element may be provided by any technical means allowing a detection of the proximity of an object through the front portion of the housing. According to a first preferred configuration, the sensing element is configured for generating a magnetic field, such that variations of this magnetic field induced by an external object can be detected. For instance, the sensing element may be provided by a coil. According to a second preferred configuration, the sensing element is provided by an optical emission source, such as a light emitting diode (LED), in order to detect variations of the emitted wave caused by an external object. In the preferred implementation according to which the sensing element is a light emission source, the front portion preferably comprises an aperture and/or a light transparent window. The light transparent window may be provided by a lens and/or a plate, in particular formed from a glass, ceramic or a synthetic material.

BRIEF DESCRIPTION OF DRAWINGS

The invention is explained in more detail hereinafter by means of preferred embodiments with reference to the drawings which illustrate further properties and advantages of the invention. The following description of the preferred embodiments is not intended as a limitation of the scope of the invention that has been described more generally above and is solely defined by the claims. The figures, the description, and the claims comprise numerous features in combination that one skilled in the art may also contemplate separately and use in further appropriate combinations. In the drawings:

FIG. 4 is a lateral view of the proximity sensor shown in FIGS. 1-3, wherein the proximity sensor is bent;

FIG. 5 is a perspective view of the proximity sensor in a bent state as shown in FIG. 4, wherein the housing is shown in a transparent manner such that internal constituent parts of the sensor are visible;

FIG. 6 is a longitudinal sectional view of the proximity sensor in a bent state as also shown in FIGS. 4 and 5;

DETAILED DESCRIPTION

Figure 1:
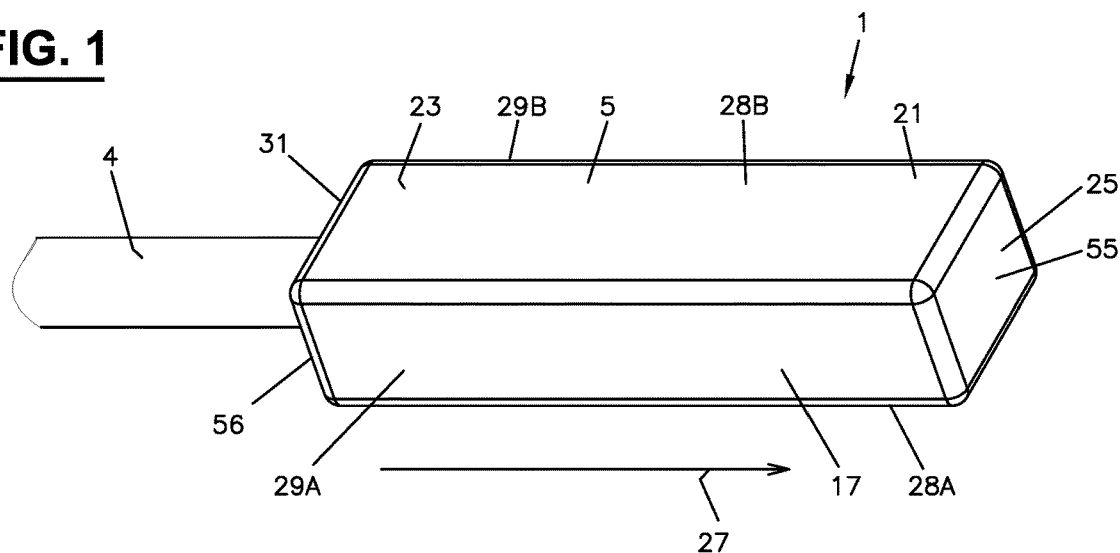
FIG. 1 is a perspective view of a proximity sensor according to the invention.
Figure 2:
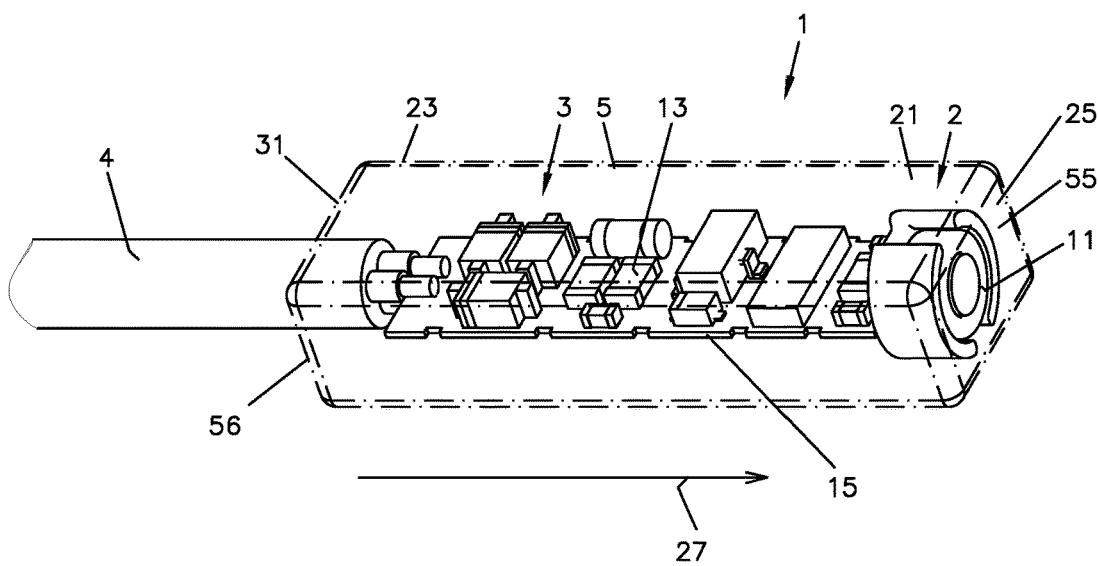
FIG. 2 is a perspective view of the proximity sensor shown in FIG. 1, wherein the housing is shown in a transparent manner such that internal constituent parts of the sensor are visible.
Figure 3:
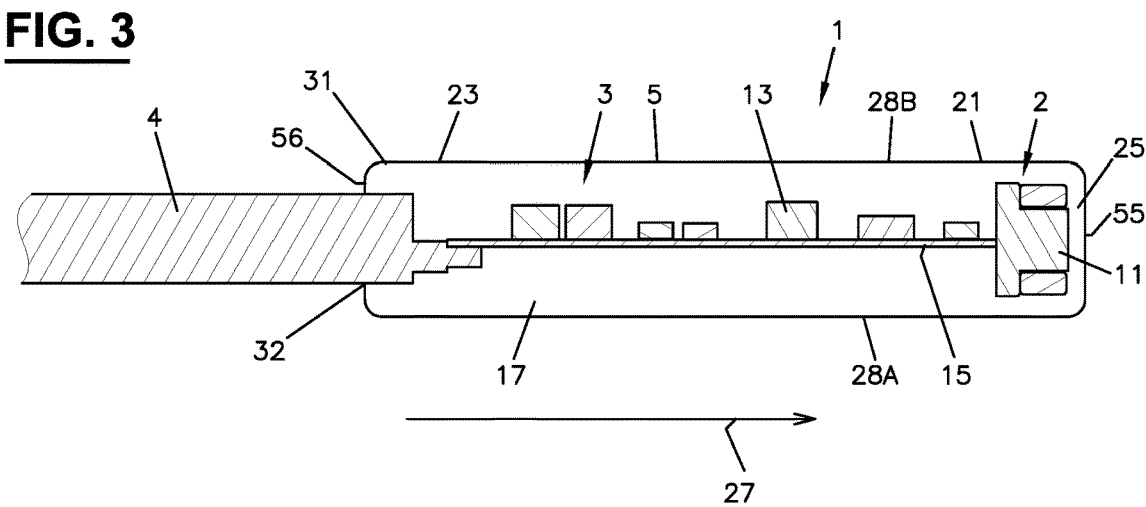
FIG. 3 is a longitudinal sectional view of the proximity sensor shown in FIGS. 1 and 2.

A proximity sensor 1, as depicted in FIGS. 1-3, comprises a sensing part 2, a detection part 3, a transmission cable 4, and a housing 5. Sensing part 2 comprises a sensing element 11. Detection part 3 comprises a detection circuitry 13 provided on a circuit board 15. Detection circuitry 13 on circuit board 15 is electrically connected to sensing element 11 in order to receive a detection signal from sensing element 11 and to convert it to a useful measuring signal that can be fed to a signal output provided by transmission cable 4.

Housing 5 comprises a front portion 21 and a rear portion 23. Sensing element 11 is inserted into front portion 21. Front portion 21 comprises a front wall 25 constituting a front end 55 of housing 5. A front side of sensing element 11 is substantially adjoining an inner surface of front wall 25. Sensing element 11 is adapted to interact with an object that is located outside front portion 21, in particular in front of front wall 25. The field and/or radiation emitted by sensing element 11 can thus be transmitted through front portion 21, for instance through front wall 25. Rear portion 23 of housing 5 comprises a rear wall 31 located at its rear end 56. Rear wall 31 has an aperture 32 through which cable 4 passes from the inner space of housing 5 to the exterior. Aperture 32 is arranged in the center of rear wall 31. Thus, a measuring signal generated by the detection circuitry can be led out from housing 5 through transmission cable 4.

A longitudinal direction 27 is defined as a direction of extension of housing 5 pointing from rear end 56 toward front end 25. Cable 4, circuit board 15 and sensing element 11 are consecutively arranged in longitudinal direction 27 of housing 5. A length of housing 5 is defined as a total dimension of housing 5 in longitudinal direction 27. Front portion 21 and rear portion 23 each constitute half of the length of housing 5. Two remaining directions that are perpendicular to longitudinal direction 27 are defining a vertical direction and a lateral direction. The width of housing 5 is defined as a total dimension of housing 5 in this vertical direction. The height of housing 5 is defined as a total dimension of housing 5 in this lateral direction. Housing 5 comprises opposing vertical side walls 28A, 28B extending in the vertical direction. Housing 5 comprises opposing lateral side walls 29A, 29B extending in the lateral direction. Side walls 28A, 28B, 29A, 29B extend in longitudinal direction 27 from rear end 56 to front end 55 of housing 5. Side walls 28A, 28B, 29A, 29B are surrounding circuit board 15.

Housing 5 is provided by a molding compound 17. Molding compound 17 is directly applied around detection part 2 and sensing part 3. Detection circuitry 13, circuit board 15 and sensing element 11 are thus embedded into molding compound 17 in such a way that they are fully enclosed by molding compound 17 which is constituting housing 5. Side walls 28A, 28B, 29A, 29B of housing 5 thus completely fill out the volume surrounding circuit board 15, detection circuitry 13 and sensing element 11. Housing 5 thus only consists of a flexible material provided by molding compound 17.

Molding compound 17 has the first purpose to provide a flexible housing 5 around circuit board 15. Molding compound 17 has the second purpose to protect detection circuitry 13 provided on circuit board 15 from a contamination and may also be useful to provide an additional fixation of detection circuitry 13 on a surface of circuit board 15. Molding compound 17 has the third purpose to protect detection circuitry 13 from a mechanical impact. In particular, the mechanical impact can be caused by a bending of housing 5 leading to a corresponding bending of circuit board 15. To avoid any damaging of the detection circuitry that would result from such a bending, molding compound 17 provides a stabilization and fixture of circuit board 15 and detection circuitry 13 provided during and after the bending. Molding compound 17 may also have the additional purposes to provide an increased temperature resistance and/or water resistance of the detection circuitry.

Circuit board 15 is provided by a flexible circuit board. Flexible circuit board 15 is formed from a flexible plastic substrate. Circuit board 15 has a length in longitudinal direction 27 exceeding a width of circuit board 15 in the vertical direction. The length exceeds the width by a factor of 4. In this way, a bending of circuit board 15 across its width expansion is facilitated as compared to a bending of circuit board 15 across its length expansion.

Circuit board 15 extends from rear portion 23 to front portion 21 of housing 5 through the middle of the length of housing 5 in longitudinal direction 27. Sensing element 11 is arranged in front of circuit board 15 in longitudinal direction 27 of housing 5. According to another implementation, at least a rear portion of sensing element 11 may be arranged on circuit board 15. According to another implementation, an entire length of sensing element 11 in longitudinal direction 27 of housing 5 may be disposed on circuit board 15. Circuit board 15 is arranged substantially in the middle of the height of housing 5. In the embodiment shown in FIGS. 1-6, a top surface of circuit board 15 is provided with components of detection circuitry 13. On a bottom surface of circuit board 15 no such components are provided. According to another embodiment not shown in the figures, the components of detection circuitry 13 are provided on the bottom surface of circuit board 15 and/or on the top surface of circuit board 15. Vertical side walls 28A, 28B of housing 5 have a thickness above the surface of circuit board 15 on which detection circuitry 13 is provided, the thickness being chosen such that it provides a sufficient protection of circuit board 15 and detection circuitry 13. Vertical side walls 28A, 28B of housing 5 have a thickness below the surface of circuit board 15 on which no components of detection circuitry 13 are provided, the thickness being chosen such that it provides a sufficient protection of circuit board 15.

The bendable surface of circuit board 15, at which detection circuitry 13 is provided, extends in the longitudinal and vertical direction of housing 5. A width of circuit board 15, being defined as its total dimension in the vertical direction of housing 5, is smaller than the width of housing 5. Circuit board 15 is substantially centered inside housing 5 in the vertical direction of housing 5. Circuit board 15 is thus spaced from an inner surface of lateral side walls 29A, 29B of housing 5. The spacing of circuit board 15 from side walls 28A, 28B, 29A, 29B of housing 5 provides a protection of circuit board 15 and detection circuitry 13 disposed thereon against external mechanical impacts on housing 5.

Furthermore, a part of transmission cable 4 is provided in rear portion 23 of housing 5. Circuit board 15 is, at least in part, arranged in front of transmission cable 4 in longitudinal direction 27 of housing 5. Transmission cable 4 is electrically connected to detection circuitry 13 on circuit board 15. The electrical connection may be provided on circuit board 15 or may be spaced further apart from circuit board 15.

FIGS. 4-6 depict proximity sensor 1 in a bent state in which sensor 1 is bent through or over a transverse direction with respect to longitudinal direction 27. In the bent state, flexible circuit board 15 and side walls 28A, 28B, 29A, 29B of housing 5 are deformed such that they have a curved shape following a curved line along longitudinal direction 27 as compared to an unbent state of proximity sensor 1 shown in FIGS. 1-3 in which flexible circuit board 15 and side walls 28A, 28B, 29A, 29B extend in a rectilinear direction of extension 27 in the unbent state of proximity sensor 1. Due to the possibility of bending flexible circuit board 15 and side walls 28A, 28B, 29A, 29B of housing 5 through the transverse direction continuously in longitudinal direction 27 at various angles in two diametrically opposed directions, a high adaptability for positioning proximity sensor 1 in vicinity of an object to be monitored outside front portion 21 can be provided.

This can greatly facilitate the geometrical arrangement of proximity sensor 1 for diverse applications and also opens up new application areas. An example is a possible application of proximity sensor 1 in a robotic system in which a continuous movement of the robotic system in any transverse direction with respect to direction of extension 27 of housing 5 can be counterbalanced such that a desired orientation of sensing element 11 can be maintained. In particular, proximity sensor 1 may be attached to or integrated in a finger of a robotic hand. The above described flexibility of proximity sensor 1 is particularly suitable for mimicking the natural movements of a human finger and can therefore also be used as an integrated component of a robotic counterpart, in which such a human finger is replicated.

A bending angle β is defined as an angle at which a part of side walls 28A, 28B, 29A, 29B in front portion 21 of housing 5 is deflectable with respect to a position of this part of side walls 28A, 28B, 29A, 29B in front portion 21 in an unbent state of sensor 1 in which side walls 28A, 28B, 29A, 29B of the complete housing 5, in particular including front portion 21 and rear portion 23, extend rectilinearly in longitudinal direction 27. In the unbent state of sensor 1 shown in FIGS. 1-3, the bending angle is 0°. In the bent state of sensor 1 shown in FIGS. 4-6, the bending angle β is 90°. In this preferred embodiment of sensor 1, side walls 28A, 28B, 29A, 29B are thus configured to be bendable at a bending angle β of at least 90°.

Figure 7:
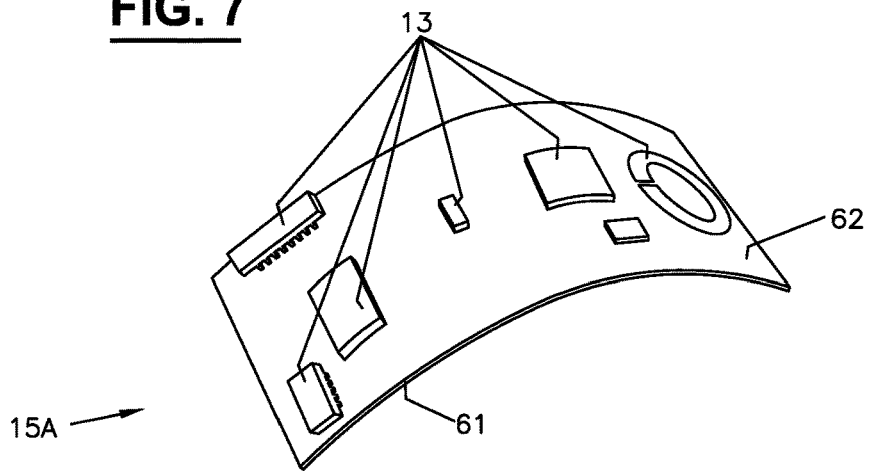
FIG. 7 is a perspective view of a circuit board according to a first configuration that can be applied in the proximity sensor shown in FIGS. 1-6.
Figure 8:
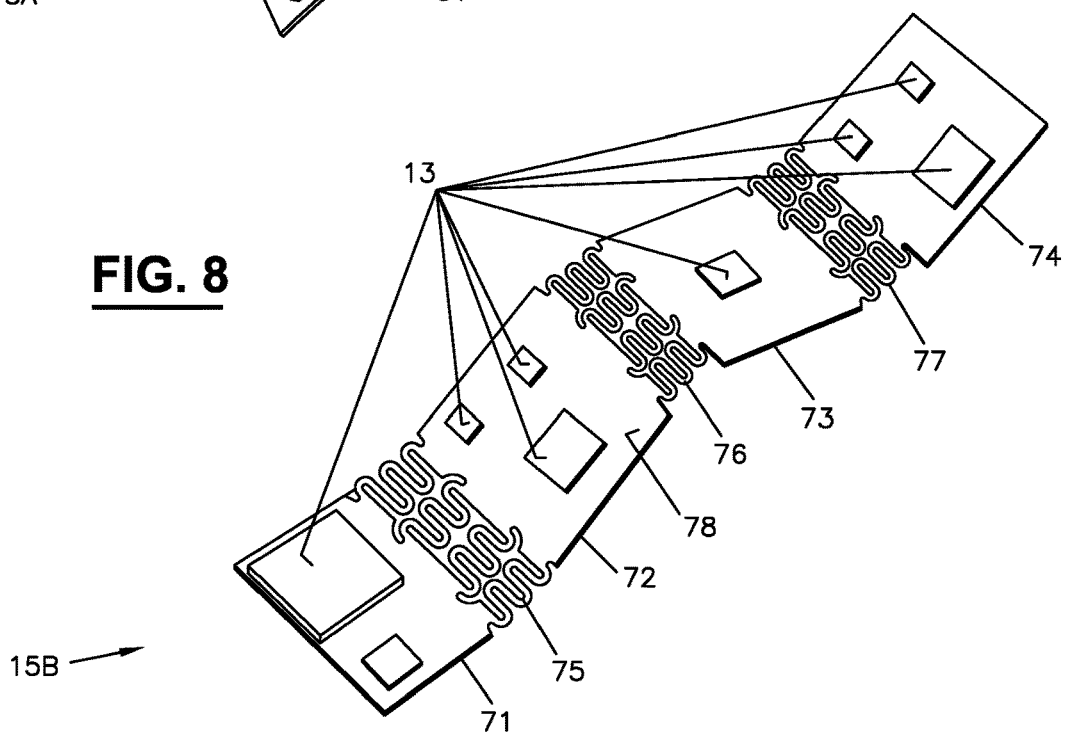
FIG. 8 is a perspective view of a circuit board according to a second configuration that can be applied in the proximity sensor shown in FIGS. 1-6.
Figure 9:
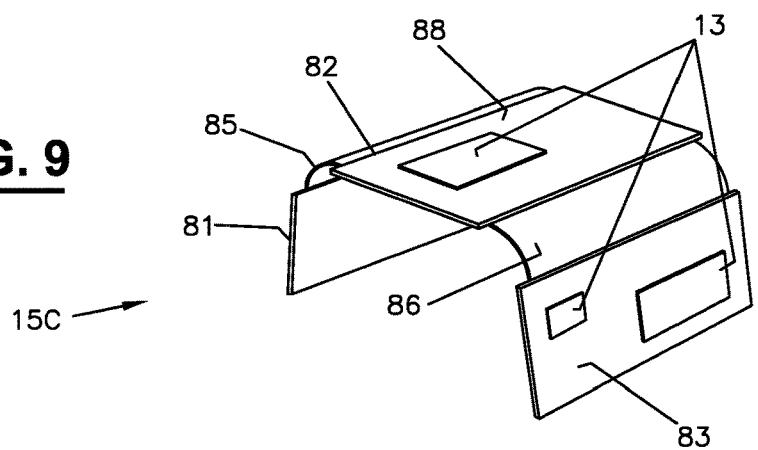
FIG. 9 is a perspective view of a circuit board according to a third configuration that can be applied in the proximity sensor shown in FIGS. 1-6.

FIGS. 7-9 depict various embodiments of bendable circuit boards 15A, 15B, 15C, that can be implemented in proximity sensor 1 in the place of circuit board 15 shown in FIGS. 1-6. Circuit board 15A shown in FIG. 7 is formed from a flexible plastic substrate 61. Substrate 61 has the shape of a plate. Therefore, flexible circuit board 15A is substantially bendable at each section of its surface 62 on which detection circuitry 13 is provided. Thus, the entire length of circuit board 15A constitutes a bendable section. Flexible circuit board 15A can be continuously bent substantially over its total surface in longitudinal direction 27, for instance in a shape in which a longitudinal section of flexible circuit board 15A follows the curved line of longitudinal direction of extension 27 of housing 5 in the bent state of proximity sensor 1.

Circuit board 15B shown in FIG. 8 comprises four plate-shaped parts 71, 72, 73, 74 formed from a rigid material. Detection circuitry 13 is provided on a surface 78 of at least one or several rigid parts 71-74. Rigid parts 71-74 are consecutively arranged. Each two neighboring rigid parts 71-74 are interconnected via a metallic connection piece 75, 76, 77. Connection pieces 75-77 are flexible such that they can be bent along a transverse direction extending in between two neighboring rigid parts 71-74. Connection pieces 75-77 each constitute a bendable section of circuit board 15B. Thus, when sensor 1 is in a bent state, as shown in FIGS. 4-6, flexible connection pieces 75-77 are bent in the direction of longitudinal direction 27 of housing 5.

Circuit board 15C shown in FIG. 9 comprises three plate-shaped parts 81, 82, 83 formed from a rigid material with detection circuitry 13 provided on their surface 88. Rigid parts 81-83 are consecutively arranged and pairwise interconnected via flexible synthetic connection pieces 85, 86. Connection pieces 85, 86 each constitute a bendable section of circuit board 15C. Thus, when sensor 1 is in a bent state, as shown in FIGS. 4-6, flexible connection pieces 85, 86 are bent in the direction of longitudinal direction 27 of housing 5.

When the above described circuit boards 15A, 15B, 15C are applied in proximity sensor 1 in the place of circuit board 15, at least each region of housing 5 surrounding a bendable section of the circuit board preferably consists of a flexible material, in particular the molding compound described above, such that sensor 1 is bendable at each of those bendable sections. According to a preferred configuration, also the more rigid parts of circuit boards 15B and 15C that are interconnected by the bendable sections are surrounded by the molding compound in order to provide a protection of these parts against contamination and mechanical impacts. Moreover, the region of housing 5 surrounding the more rigid parts of circuit boards 15B and 15C may further include additional features such us a rigid shell in order to provide further protection and to avoid a destruction of these rigid parts of circuit boards 15B and 15C during a bending of sensor 1.

From the foregoing description, numerous modifications of the proximity sensor according to the invention are apparent to one skilled in the art without leaving the scope of protection of the invention that is solely defined by the claims.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A proximity sensor for detecting a proximity of an object, the proximity sensor comprising a sensing element, a detection circuitry provided on a circuit board, and a housing with a rear portion adjoining a rear end of the housing and a front portion adjoining a front end of the housing, the sensing element being arranged inside the front portion of the housing such that it is adapted to interact with the object through the front portion, the detection circuitry being interconnected with the sensing element in order to receive a detection signal from the sensing element, the housing comprising side walls extending in a longitudinal direction from the rear end to the front end of the housing, the side walls surrounding the circuit board, wherein the circuit board comprises at least one bendable section extending in a transverse direction with respect to said longitudinal direction and that the side walls substantially consist of at least one flexible material in a region surrounding said bendable section of the circuit board such that the proximity sensor is bendable through said transverse direction.

2. The proximity sensor according to claim 1, wherein the circuit board extends through a middle of a length of the housing in said longitudinal direction.

3. The proximity sensor according to claim 1, wherein said circuit board has a length in said longitudinal direction exceeding a width of said circuit board perpendicular to said longitudinal direction by at least a factor of 1.5, more preferred by at least a factor of 2.

4. The proximity sensor according to claim 1, wherein the side walls have a height perpendicular to said longitudinal direction that is smaller than a length of the circuit board in said longitudinal direction by at least a factor of 3.

5. The proximity sensor according to claim 1, wherein the side walls constitute a substantially rectangular cross section of the housing perpendicular to said longitudinal direction.

6. The proximity sensor according to claim 1, wherein the side walls substantially fill out a volume surrounding the circuit board and detection circuitry in said region of the side walls consisting of said flexible material.

7. The proximity sensor according to claim 1, wherein said flexible material of the side walls is provided by at least one molding compound.

8. The proximity sensor according to claim 7, wherein said at least one molding compound has a thickness of at least 0.5 mm on top of a surface of the circuit board on which components of the detection circuitry are provided.

9. The proximity sensor according to claim 7, wherein said at least one molding compound has a thickness of at least 0.2 mm on top of a surface of the circuit board on which no components of the detection circuitry are provided.

10. The proximity sensor according to claim 7, wherein said at least one molding compound covers the front end of the housing such that a front wall of the housing is provided by the molding compound.

11. The proximity sensor according to claim 7, wherein said at least one molding compound is provided at least over a distance of a length of the circuit board in said longitudinal direction.

12. The proximity sensor according to claim 1, further comprising a transmission cable, the transmission cable being connected to said detection circuitry inside the housing and passing through the rear portion of the housing toward an exterior of the housing such that a measuring signal generated by the detection circuitry can be transmitted by the transmission cable.

13. The proximity sensor according to claim 12, wherein the transmission cable is passing through the rear end of the housing.

14. The proximity sensor according to claim 7, wherein said flexible material of the side walls is provided by at least one molding compound and wherein a passage of the transmission cable through the housing is surrounded by said at least one molding compound.

15. The proximity sensor according to claim 1, wherein the side walls are configured to be bendable at a bending angle of at least 30°, the bending angle being defined as an angle at which a portion of the side walls is deflectable in a bent state of the proximity sensor from a position of said portion of the side walls in an unbent state of the proximity sensor in which the side walls extend rectilinearly in the longitudinal direction.

16. The proximity sensor according to claim 1, wherein the side walls are configured to be bendable at a bending angle of at least 90°, the bending angle being defined as an angle at which a portion of the side walls is deflectable in a bent state of the proximity sensor from a position of said portion of the side walls in an unbent state of the proximity sensor in which the side walls extend rectilinearly in the longitudinal direction.

* * * * *